United States Patent
Graf

(10) Patent No.: US 7,265,566 B2
(45) Date of Patent: Sep. 4, 2007

(54) SEMICONDUCTOR COMPONENT ARRANGEMENT HAVING A TEMPERATURE-BASED DEFECT IDENTIFICATION

(75) Inventor: Alfons Graf, Kaufering (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 10/994,163

(22) Filed: Nov. 19, 2004

(65) Prior Publication Data

US 2005/0133855 A1 Jun. 23, 2005

(30) Foreign Application Priority Data

Nov. 21, 2003 (DE) ............................... 103 54 443

(51) Int. Cl.
*G01R 31/02* (2006.01)

(52) U.S. Cl. .................. 324/763; 324/760; 324/765

(58) Field of Classification Search ............... 324/763, 324/769, 765, 754, 158.1; 257/48; 438/14, 438/17, 18

See application file for complete search history.

(56) References Cited

U.S. PATENT DOCUMENTS

| | | | | |
|---|---|---|---|---|
| 5,473,259 A | * | 12/1995 | Takeda | .................. 324/760 |
| 5,956,350 A | * | 9/1999 | Irrinki et al. | ............... 714/718 |
| 5,982,189 A | * | 11/1999 | Motika et al. | ............... 324/763 |
| 6,147,396 A | | 11/2000 | Troger et al. | |
| 6,297,995 B1 | * | 10/2001 | Mc Connell et al. | ....... 365/201 |
| 6,504,697 B1 | | 1/2003 | Hille | |
| 6,861,860 B2 | * | 3/2005 | Maggi et al. | ............... 324/760 |
| 6,873,170 B2 | * | 3/2005 | Asam et al. | ................. 324/765 |
| 2002/0167065 A1 | | 11/2002 | Graf et al. | |
| 2003/0057986 A1 | * | 3/2003 | Amick et al. | ............... 324/760 |

FOREIGN PATENT DOCUMENTS

| | | |
|---|---|---|
| DE | 198 05 785 C1 | 6/1999 |
| DE | 199 04 575 C1 | 3/2000 |
| DE | 101 22 363 A1 | 11/2002 |
| DE | 197 45 040 C2 | 3/2003 |
| DE | 102 27 009 A1 | 1/2004 |
| EP | 1180691 A1 * | 2/2002 |

* cited by examiner

*Primary Examiner*—Minh N. Tang
(74) *Attorney, Agent, or Firm*—Maginot Moore & Beck

(57) ABSTRACT

A semiconductor component arrangement includes a semiconductor body, at least a first power semiconductor switching element, and a defect identification circuit. The semiconductor body has a front side and a rear side, and the first power semiconductor switching element is integrated therein. The defect identification circuit is integrated in the semiconductor body, and is displaced at a distance from the first semiconductor switching element. The defect identification circuit includes a temperature sensor and an evaluation circuit, the evaluation circuit coupled to the temperature sensor and configured to generate a defect signal in the event of a sensed temperature indicative of the presence of a defect in the at least one semiconductor switching element. The evaluation circuit has a second semiconductor switching element and a drive circuit therefore.

18 Claims, 9 Drawing Sheets

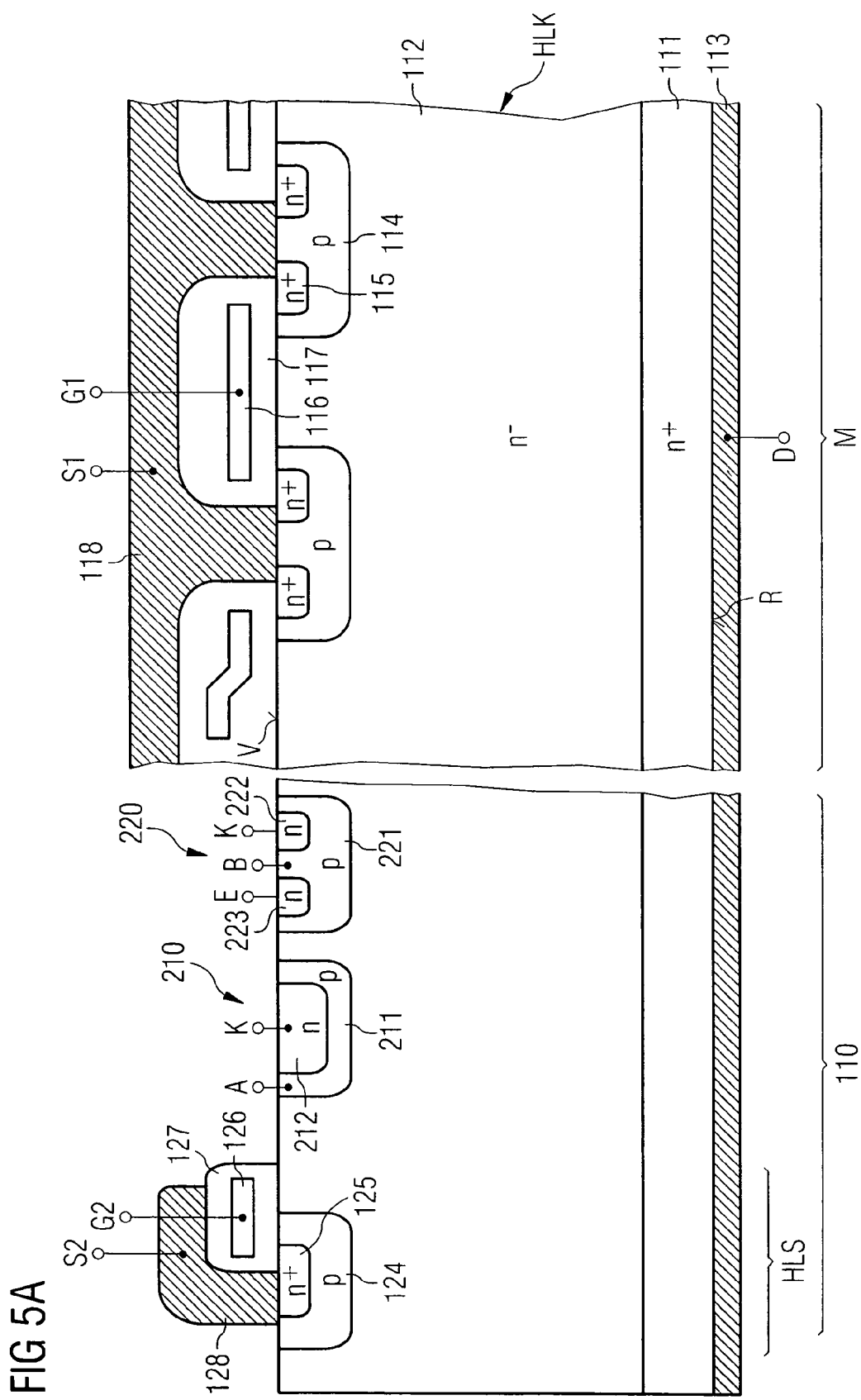

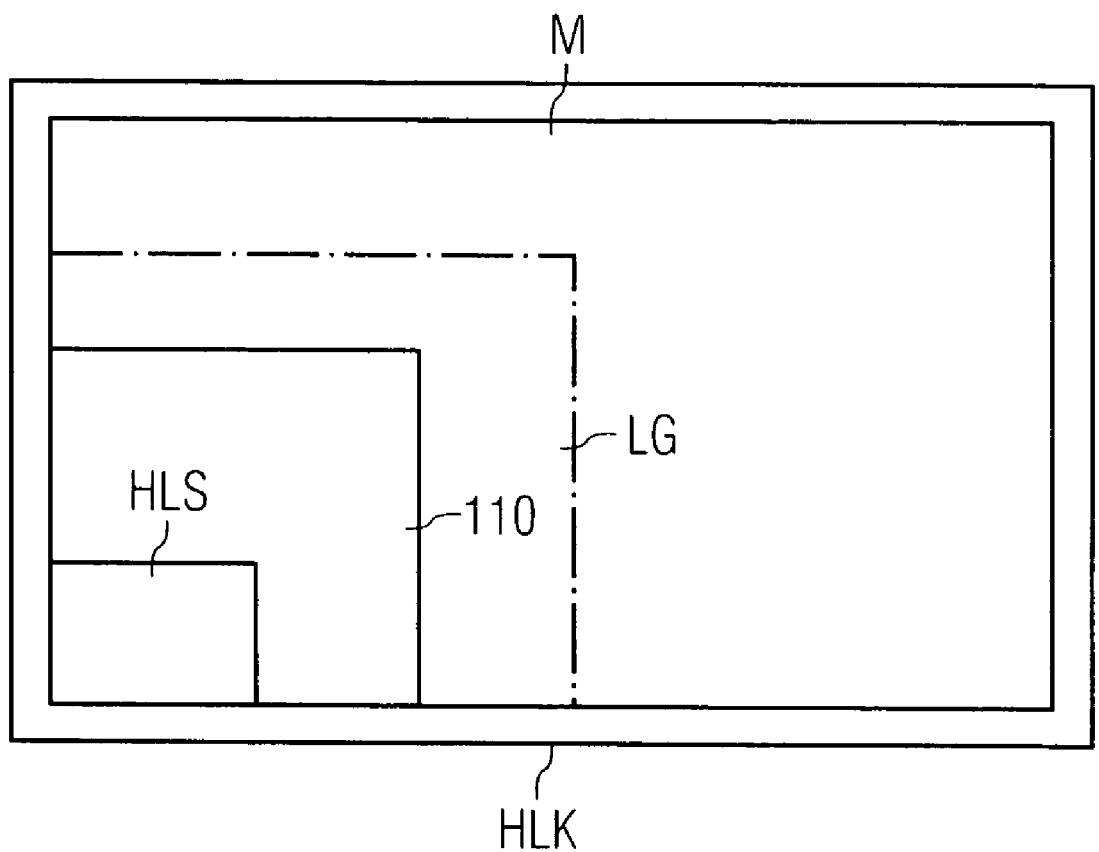

SEMICONDUCTOR COMPONENT ARRANGEMENT HAVING A TEMPERATURE-BASED DEFECT IDENTIFICATION

The present invention relates to a semiconductor component arrangement with a semiconductor switching element and a defect identification circuit.

Semiconductor switching elements are in widespread use for switching electrical loads. Such semiconductor switching elements, in particular power MOSFETs, are further gaining in importance for example in motor vehicles for switching lighting systems or for driving electric motors, for example for window winding mechanisms or seat adjustors.

During operation of such semiconductor switching elements, in rare cases a defect may occur which has the effect that the semiconductor switching element no longer turns off completely and a current flows through it permanently as a result. In the extreme case, this may lead to the semiconductor switching element being heated to such a great extent that a housing that is usually formed by a plastic molding composition and surrounds the semiconductor switching element or a circuit board on which the semiconductor switching element is fixed is damaged or even starts to burn.

It is known to detect the temperature of a semiconductor switching element by means of a temperature sensor and to implement further measures that prevent a further increase in temperature. Various methods have been disclosed hitherto in this regard.

DE 198 05 785 C1 describes a power semiconductor module that irreversibly interrupts the load circuit of a power semiconductor component in the event of the load circuit being heated to an impermissibly great extent. For this purpose, interruption means are provided which, in the event of an impermissibly high temperature occurring have a volume-expanding characteristic, which, in the event of a temperature threshold being exceeded, force open the load terminals of the power component and, consequently, interrupt the load circuit in a defined and irreversible manner.

The problem of such interruption means consists in the fact that their processing temperature approximately corresponds to the temperature at which this thermally ignitable material is intended to respond. The highest processing temperature during the mounting of the semiconductor module is approximately 270° C. by way of example. The ignition temperature of the thermally ignitable material must therefore be sufficiently higher than the maximum processing temperature in order to avoid possible incorrect triggering. In many cases, therefore, use is made of a thermally ignitable material that only ignites above a temperature of more than 300° C. However, application situations exist in which the semiconductor component already incurs damage at temperatures which approximately correspond to the processing temperatures and at which the interruption means do not yet trigger.

DE 101 22 363 A1 describes a power semiconductor module in which is integrated a circuit that diagnoses the thermal destruction of a power semiconductor component. In the case of this module, the load circuit of the power semiconductor component is reliably interrupted in the event of a defect in the load circuit but not in the event of a superelevated operating temperature. A temperature sensor designed as a thyristor supplies a diagnosis signal in the event of destruction. In order to ensure that the diagnosis circuit still generates a functional diagnosis signal even at a very high housing temperature and despite a destroyed power semiconductor component, the diagnosis circuit is preferably constructed using chip-on-chip technology. The temperature sensor outputs a signal to the diagnosis circuit only when a temperature threshold is exceeded and when the supply voltage is simultaneously present, said diagnosis circuit, depending on said signal, driving an interruption device that irreversibly interrupts the load-current-carrying output lines of the power semiconductor.

It is an aim of the present invention to provide a semiconductor component arrangement which comprises a semiconductor body with a semiconductor switching element and a defect identification circuit, in which the defect identification circuit makes a defect signal available in the event of a temperature indicating a defect in the semiconductor switching element and which can be realized in a simple manner.

This aim is achieved by means of a semiconductor component arrangement in accordance with claim 1. The subclaims relate to advantageous refinements of the invention.

The semiconductor component arrangement according to the invention comprises a semiconductor body, with a front side and a rear side, at least one first semi-conductor switching element integrated in the semiconductor body and a defect identification circuit integrated in the semiconductor body. In this case, the defect identification circuit is arranged adjacent to the at least one semiconductor switching element and comprises a temperature sensor and also an evaluation circuit. The defect identification circuit makes a defect signal available in the event of a temperature indicating a defect in the at least one semiconductor switching element. The evaluation circuit, for providing the defect signal, has a second semiconductor switching element and a drive circuit for the second semiconductor switching element.

In order to ensure that a defect in the at least one first semiconductor switching element arranged in the semiconductor body is detected and a defect signal is output, even when damage to the first semiconductor switch has already occurred, the defect identification circuit, although thermally coupled to the first semiconductor switching element via the semiconductor body, is arranged at a distance from the at least one semiconductor switching element. In this case, the defect identification circuit is preferably positioned in a region of the semiconductor body which, in the event of the at least one first semiconductor switching element being overheated due to a defect, is the last region of the semiconductor body to be destroyed, for example at the edge of the semiconductor body.

Besides the temperature sensor, the defect identification circuit has an evaluation circuit, which is fed a temperature signal output by the temperature sensor in the event of the temperature indicating the defect in the semiconductor switching element, the evaluation circuit outputting the defect signal in accordance with said temperature signal.

The first semiconductor switching element may be designed as a vertical transistor, with the result that the load path thereof runs perpendicular to the front and rear sides of the semiconductor body. In the case of this construction, the second semiconductor switching element may be connected to a supply potential via a rear-side metallization of the semiconductor body. This type of contact-connection of the second semiconductor switch is resistant for some time even at high temperatures in order to ensure a voltage supply of the second semiconductor switch, and thus a defect signal generator.

However, the second semiconductor switching element may also be designed as a lateral transistor with a load path running parallel to the front or rear side of the semiconductor body.

Preferably, the second semiconductor switching element of the defect identification circuit and the first semiconductor switching element are connected to the same supply voltage via the rear-side metallization. This ensures that the defect identification circuit makes a defect signal available only when the supply voltage is present and when there is a defect in the at least one semiconductor switching element.

Preferably, an external interruption device, that is to say one arranged outside the semiconductor body and outside a housing surrounding the semiconductor body, is provided, which is fed the defect signal and interrupts the voltage supply of the first semiconductor switch in the event of a defect in order to prevent a further current flow through the first semiconductor switching element, and thus further heating of the semiconductor switching element. As a result of this, other components are protected and a fire is avoided.

The temperature which indicates the defect and at which the defect identification circuit outputs a signal indicating a defect preferably lies between the intrinsic temperature of the material used for the semiconductor body and a temperature at which a transition from a solid to a liquid state of matter starts to take place in the semiconductor body or in leads of the semiconductor body, or a temperature at an ignition temperature of materials surrounding the semiconductor body. Such temperatures lie far above the operating temperature of the semiconductor switching element and thus reliably indicate a defect in the component.

One embodiment provides for the defect identification circuit to make the defect signal permanently available in the event of the temperature indicating the defect in the first semiconductor switching element being reached or exceeded a single time, even if the temperature subsequently falls again.

In one embodiment of the arrangement, the defect signal is output via a separate output of the defect identification circuit. In a further arrangement, the defect signal is passed to a drive input available for driving the first semiconductor switching element.

Depending on the embodiment, the temperature sensor used may be a temperature-dependent resistor, a diode which is operated in the reverse direction and whose reverse current is evaluated, a bipolar transistor which is connected up as a diode and whose leakage current is evaluated, or a fusible link that triggers in a temperature-dependent manner.

After blowing on account of a temperature indicating a defect, the fusible link that triggers in a temperature-dependent manner irreversibly indicates that said temperature has been reached a single time, the drive circuit being designed to drive the second semiconductor switch depending on the respective state of the fuse such that the semiconductor switching element assumes a first or a second switching state, and the defect signal thus assumes a first or a second signal level.

With the use of reversible temperature sensors, too, the fact that such a defect temperature has been reached a single time can be permanently indicated if the drive circuit contains a fusible link on whose fuse state the switching state of the second semiconductor switch depends and which is triggered when a temperature that indicates a defect and is detected by the sensor is reached.

The drive circuit may contain a Schmitt trigger that is driven in a temperature-dependent manner by means of the temperature sensor. As soon as the Schmitt trigger receives a defect temperature signal output by the temperature sensor in the event of a temperature indicating a defect, the Schmitt trigger changes its operating state and drives the second semiconductor switching element into the on state or into the off state.

In a further embodiment, the drive circuit comprises a bipolar transistor which, like the Schmitt trigger, is driven in a temperature-dependent manner by means of a temperature sensor. The bipolar transistor in the drive circuit changes its operating state as soon as the temperature signal of the temperature sensor indicates a defect in the first semiconductor switching element, and drives the second semiconductor element depending on its operating state.

In a further embodiment, the bipolar transistor serves as a temperature sensor. The latter is connected between a supply terminal and a control terminal of the second semiconductor switching element. The leakage current of the bipolar transistor represents the temperature signal by means of which the second semiconductor switching element is driven into the on state or into the off state.

The present invention is explained in more detail below in exemplary embodiments with reference to figures.

FIG. 1 schematically shows a semiconductor component arrangement—integrated in a semiconductor body—with a first semiconductor switch and a defect identification circuit comprising a temperature sensor and an evaluation circuit with a second semiconductor switch.

FIG. 2 schematically illustrates the spatial position of the first semiconductor switch and the defect identification circuit on the semiconductor body.

FIG. 5 shows, for the purpose of illustrating the spatial position of the individual circuit components in the semiconductor body, a cross section through the semiconductor body (FIG. 5*a*) and a plan view of the semiconductor body (FIG. 5*b*) in a first exemplary realization with a second semiconductor switch designed as a vertical transistor.

In the figures, unless specified otherwise, identical reference symbols designate identical parts with the same meaning.

Figure 1:
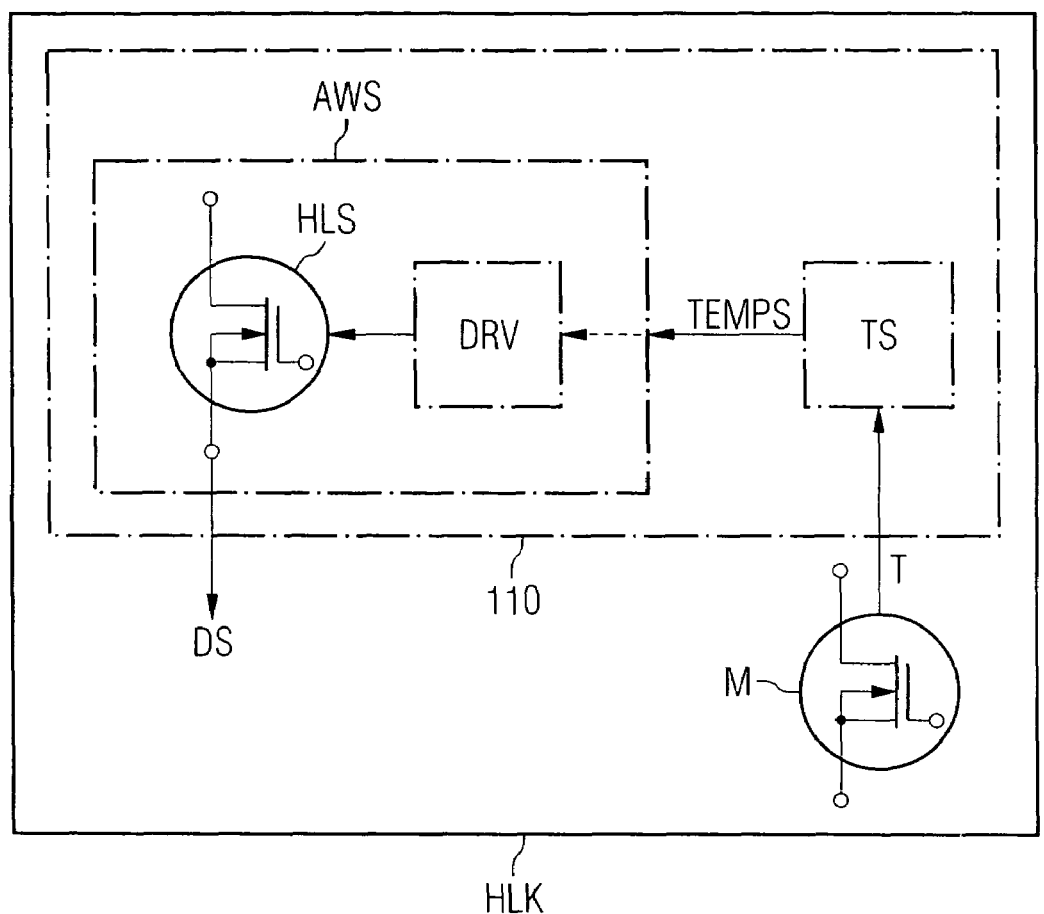

FIG. 1 shows a component arrangement with a first semiconductor switching element M and a defect identification circuit 110 integrated in a semiconductor body HLK. The task of the defect identification circuit 110 is to identify a defect in the at least one first semiconductor switching element M on the basis of a temperature indicating a defect in the component and to make a defect signal DS available at an output depending on the detection of such a defect.

For this purpose, the defect identification circuit 110 is thermally coupled to the at least one first semiconductor switching element M and has a temperature sensor TS and an evaluation circuit AWS. The evaluation circuit AWS, which is fed a temperature signal TEMPS from the temperature sensor TS, comprises a drive circuit DRV and a second semiconductor switching element HLS driven by said drive circuit DRV, the defect signal DS being dependent on the switching state of said second semiconductor switching element.

The first and second semiconductor switching elements M, HLS are designed as MOSFETs in the example in accordance with FIG. 1, without, however, restricting the invention to this concrete configuration.

The defect signal DS may be fed, in a manner that is not specifically illustrated, by way of example to a device that interrupts the supply voltage of the first semiconductor switching element M in order, in the event of detection of a defect, to prevent a further current flow through this component and thus further heating.

Figure 2:
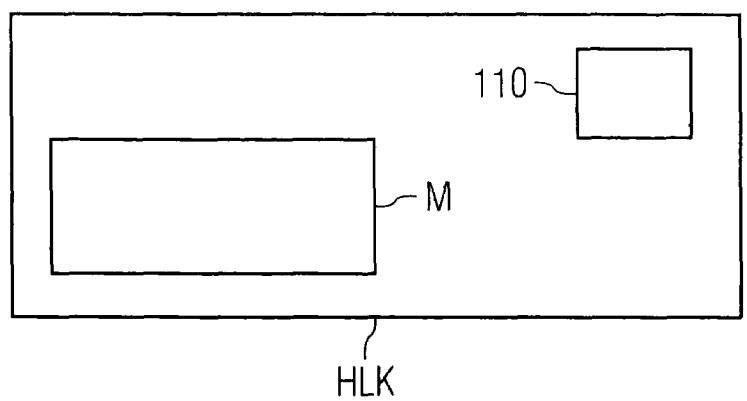

FIG. 2 schematically shows a plan view of the semiconductor body HLK outlining the positions of the first semiconductor switching element M and the defect identification circuit 110 in the semiconductor body HLK. In the example, the defect identification circuit 110 is arranged at a distance from the first semiconductor switching element M and in the edge region of the semiconductor body HLK which is the furthest away from the at least one first semiconductor switching element M. Arranging the defect identification circuit 110 in the edge region is based on the insight that, in the event of a defect in the first semiconductor switch M that leads to the semiconductor body HLK being heated, the edge regions that are the furthest away from the first semiconductor switch M are damaged/destroyed last, with the result that a defect signal can still be reliably generated even in the event of the component already having been partially destroyed.

On account of the distance between the first semiconductor switching element M and the defect identification circuit 110, there is a temperature difference between these components owing to an unavoidable thermal resistance of the semiconductor body HLK. Taking account of this temperature difference, the defect identification circuit 110 may be designed such that it already generates a defect signal indicating a defect or a destruction of the semiconductor body HLK when temperatures at which destruction does not yet occur are present in the edge region, while in the region of the first semiconductor switching element M the temperatures may already have risen so far that destruction occurs.

Figure 3:
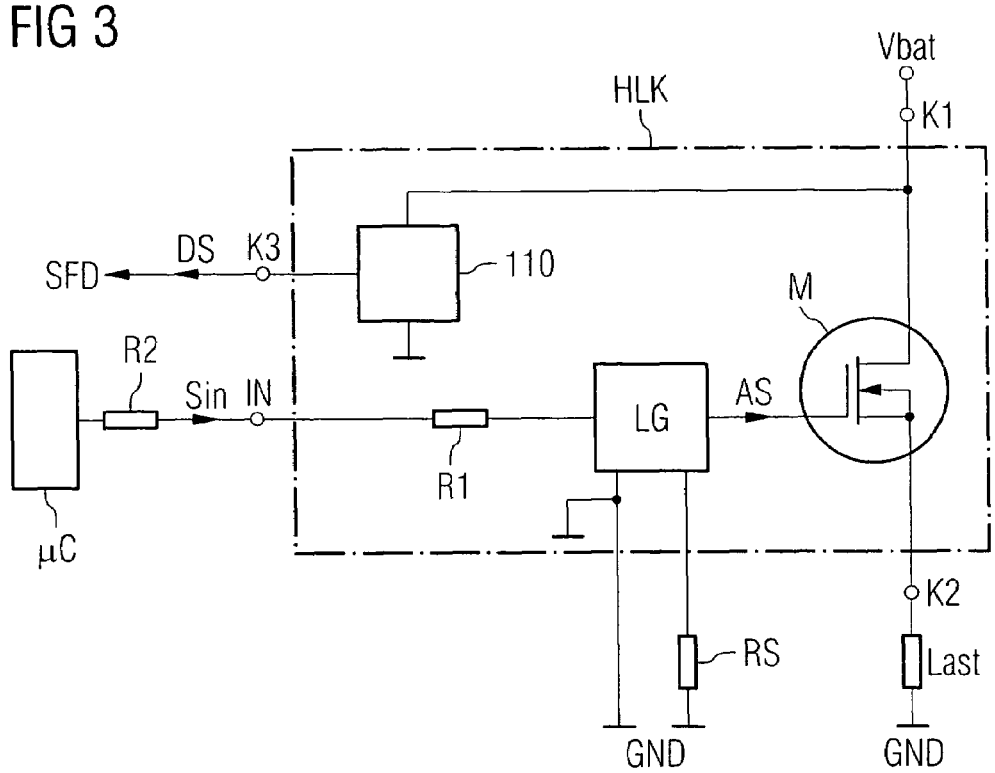
FIG. 3 illustrates a first exemplary embodiment of a semiconductor component arrangement according to the invention, in which a defect signal is made available at a separate output of the arrangement.

Referring to FIG. 3, a drive circuit LG may also be integrated in the semiconductor body besides the first semiconductor switching element M and the defect identification circuit, said drive circuit providing a drive signal AS for the first semiconductor switching element M in accordance with an input signal Sin present at an input IN. Said input signal Sin is provided by a microcontroller μC in the example.

Resistors R1, R2 connected between the microcontroller μC and the input terminal IN and between the drive circuit LG and the input terminal IN serve for current limiting.

In addition to converting the input signal Sin into a drive signal for the first semiconductor switch M, the drive circuit LG may also encompass, in a manner that is not specifically illustrated, protection functions for protecting the semiconductor switch M against excessively high load currents, excessively high load path voltages or against overtemperature. For current detection, the drive circuit LG is connected to an external current sensing resistor in the example. These protection functions can only be ensured in the case of a functional semiconductor switch M, the semiconductor switch M for example being turned off or limited by regulation if one of the aforementioned disturbance states occurs.

In the example, the first semiconductor switching element M serves for driving a load, for which purpose its load path is connected in series with the load between a supply potential Vbat and reference-ground potential GND. In a manner that is not specifically illustrated, the semiconductor body HLK is integrated in a housing having terminals K1, K2 for connecting the load and the supply voltage Vbat.

The defect identification circuit is likewise connected between the supply voltage Vbat and reference-ground potential GND, this ensuring that the defect identification circuit 110 makes a defect signal DS available only when the supply voltage is present. The defect signal DS is available at an output K3 in order to be able to process it further for example in the microcontroller μC or another suitable circuit.

Figure 4:
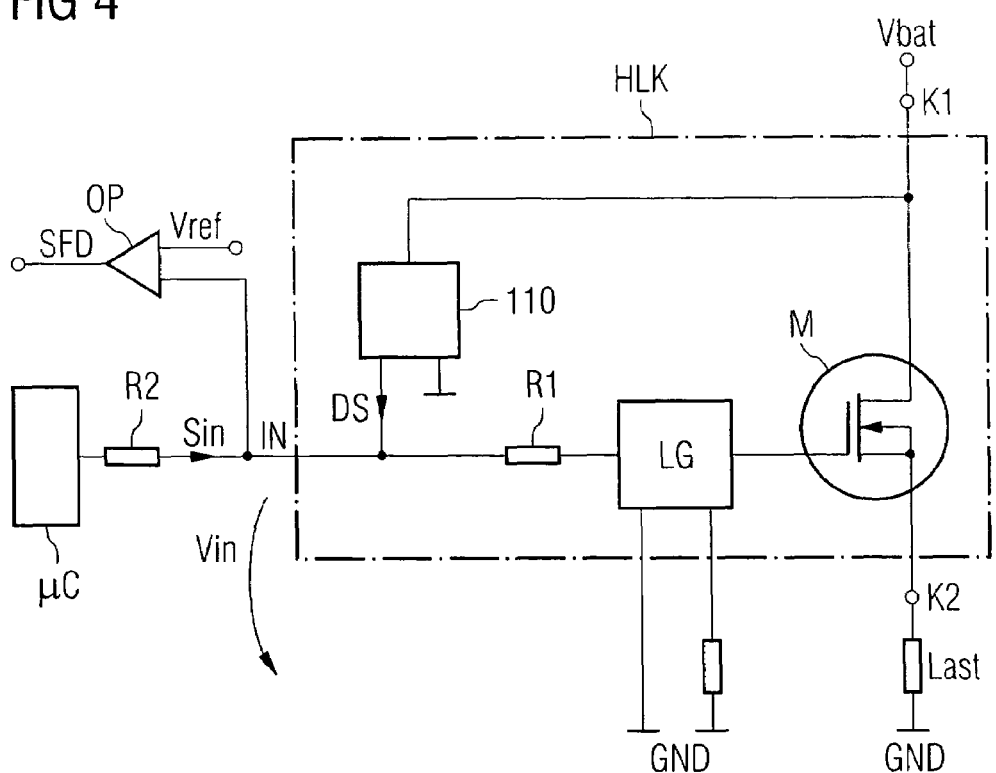
FIG. 4 shows a modification of the exemplary embodiment illustrated in FIG. 3, in which the defect signal is output via a drive input for the first semiconductor switch.

FIG. 4 shows a modification of the arrangement illustrated in FIG. 3, in the case of which an output of the defect identification circuit 110 at which the defect signal DS is available is connected to the input terminal IN thereby saving a separate terminal for outputting the defect signal DS.

In this case, a defect-indicating level of the defect signal is chosen such that it differs clearly from levels applied to the input by the microcontroller μC for driving the semiconductor switch M. To detect whether such a defect-indicating level of the defect signal DS is present at the input IN, a comparator is provided which compares the level at the input IN with a reference value Vref.

The defect identification circuit is designed in such a way that its output is at high impedance if no defect is present, in order that the input signal Sin supplied by the microcontroller μC is at least approximately not influenced. In the defect situation, the defect signal "overwrites" the input signal Sin, but this does not affect the functioning since it is to be assumed in the defect situation that the first semiconductor switching element M no longer reacts to the input signal Sin, or the drive signal AS derived therefrom. If the first semiconductor switching element M should nevertheless react to the defect signal DS, whose high level indicates a defect situation, and switch on, then no disadvantages result from this. The defect signal DS is generated by the defect signal generating circuit 110 only at very high temperatures that indicate damage to the first semiconductor switch M. By virtue of a still functioning part of the defective first semiconductor switching element M switching on or partially switching on, the voltage drop and thus the power loss across the semiconductor switching element M is reduced, as a result of which the overtemperature caused by the destruction is reduced again, if appropriate.

FIG. 5a illustrates the construction of the component arrangement according to the invention on the basis of a cross section through the semiconductor body HLK in which the first semiconductor switching element M and also the defect identification circuit 110 with the second semiconductor switching element HLS are integrated.

Both the first and the second semiconductor switching element M, HLS are designed as vertical MOS transistors in the example, the drain terminals thereof being jointly contact-connected. The semiconductor body HLK, which has a front side V and a rear side R, comprises a heavily doped semiconductor zone 111 in the region of its rear side R, said semiconductor zone forming a common drain zone of the two MOSFETs M, HLS. Said drain zone 111 is adjoined by a more weakly doped semiconductor zone 112, which forms the drift zone of the two MOSFETs. The drain zone 111 is doped by the same conduction type as the drift zone in the case of a MOSFET; the drain zone is doped complementarily to the drift zone in the case of an IGBT.

A cell array with a plurality of body zones 114 doped complementarily to the drift zone 112 is introduced into said semiconductor zone 112 in the region of the front side for the purpose of forming the first semiconductor switch M, the body zones 114 being arranged between the drift zone 112 and source zones 115 respectively introduced into the body zones 114. The source zones 115 are doped complementarily to the body zones 114. In order to form a conductive channel in the body zones 114 between the source zones 115 and the drift zone 112, a gate electrode 116 is present, which is arranged in a manner insulated from the semiconductor body HLK by a gate insulation 117. The source zones are contact-connected by a common source electrode 118, which forms the source terminal S1 of the first semiconductor switching element M.

In order to form the second semiconductor switching element HLS, at least one further transistor cell with a body zone 124 and a source zone 125 arranged in the body zone 124 is present at a distance from the cell array of the first semiconductor switching element M. In order to form a conductive channel in the body zone between the source zone 125 and a section of the drift zone 112, a further gate electrode 126 is present, which is arranged in a manner insulated from the semiconductor body HLK by a further insulation layer 127. The first and second semiconductor switch M, HLS have a common drain zone 111 to which a drain electrode 113 is applied.

The second semiconductor switch HLS of the defect identification circuit 110 is arranged at a distance from the cells of the first semiconductor switch M in the edge region of the semiconductor body HLK. It is to be assumed that, in the event of a defect in the first semiconductor switch that leads to the semiconductor body HLK being severely heated and damaged, this damage occurs last at the edge at a distance from the first semiconductor switch M, with the result that a defect signal can still be generated even if the first semiconductor switch M has already been destroyed. The illustration of edge structures that are required, if appropriate, for increasing the dielectric strength of the component in the edge region during disturbance-free operation has been dispensed with in FIG. 5 and in the subsequent FIGS. 6 and 12 for reasons of clarity.

Designing the second semiconductor switch HLS as a vertical transistor affords the advantage that one of the load path terminals of said semiconductor switch HLS can be contact-connected by the large-area rear side metallization 113 that contact-connects the drain zone 111, in which case it is to be assumed that this large-area terminal electrode 113 is resistant for a long time in the defect situation, but at least as long as the defective first semiconductor switch whose load current causes the heating is supplied with the heat-generating current via the same terminal electrode 113.

The remaining integrated components of the defect identification circuit 110 are integrated in the region of the front side V in the semiconductor body HLK. FIG. 5 illustrates as representative of these components only a lateral diode 210 with an anode zone 211 and a cathode zone 212 and a lateral npn bipolar transistor 220 with a base zone 221, a collector zone 222 and an emitter zone 223. The second semiconductor switch HLS and the defect identification circuit 110 should spatially be arranged as near as possible next to one another and at the same time lie as far as possible away from the first semiconductor switch M. In order to illustrate this distance between the defect identification circuit 110 and the first semiconductor switch M, the semiconductor body HLK is illustrated in interrupted fashion in FIG. 5a.

Additional circuit components that are independent of the defect identification circuit, such as, by way of example, a drive circuit LG in accordance with FIG. 4, may be arranged in the region between the defect identification circuit and the semiconductor body. The arrangement of said drive circuit LG in the semiconductor body between the defect identification circuit 110 and the semiconductor switch M is depicted by broken lines in FIG. 5b.

FIG. 5b illustrates, in a plan view of the semiconductor body HLK, the position of the cell array of the first semiconductor switch and the defect identification circuit 110 with the second semiconductor switch HLS arranged at the edge of the semiconductor body HLK.

Figure 6:
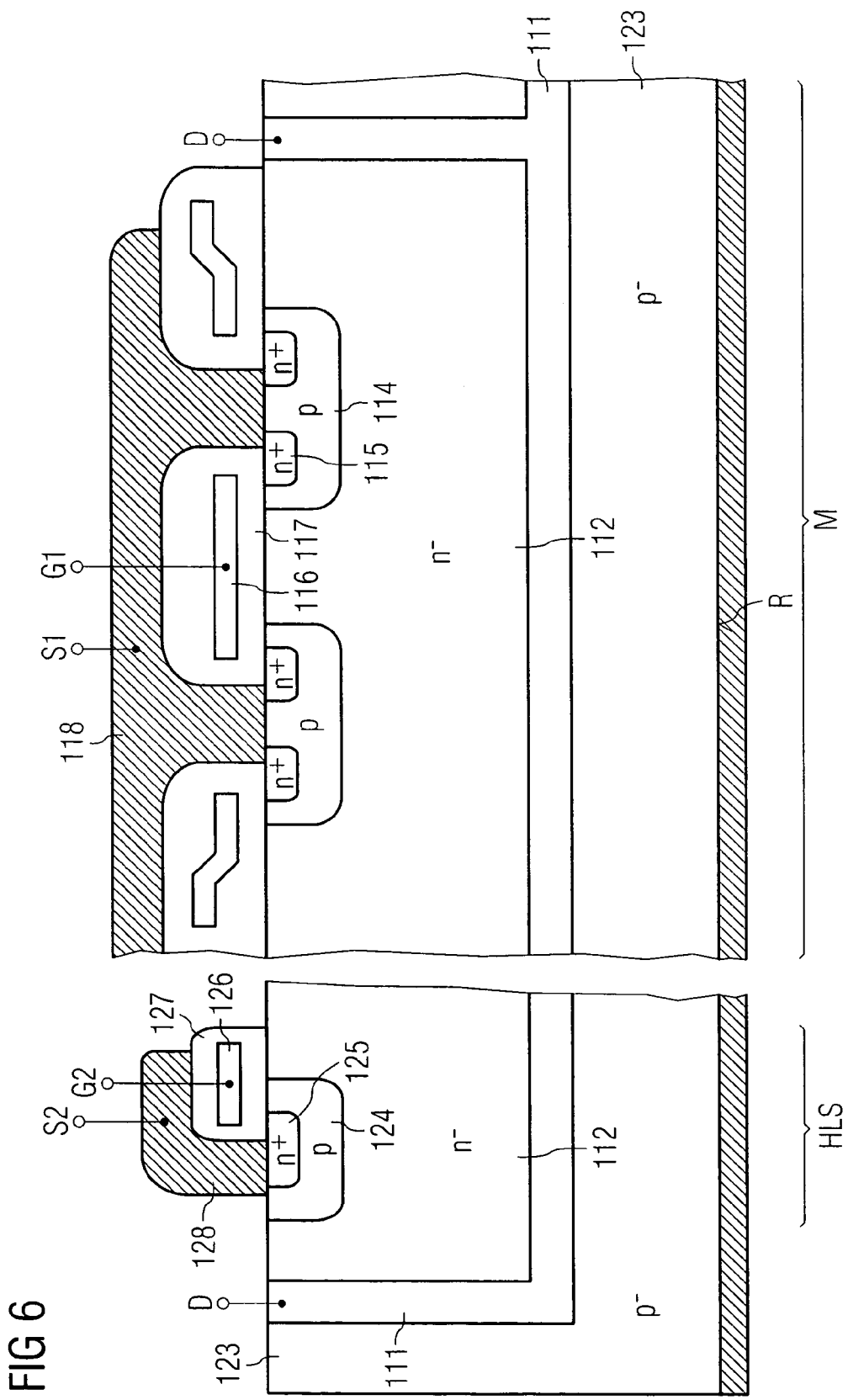
FIG. 6 shows a cross section through the semi-conductor body of the semiconductor component arrangement in a second exemplary realization.

FIG. 6 shows a modification of the construction of the semiconductor body HLK illustrated in FIG. 5a. While the drain terminals of the first and second semiconductor switches are contact-connected via the rear side R of the semiconductor body in the case of the embodiment in accordance with FIG. 5a, this contact-connection is effected via the front side V in the case of the embodiment illustrated in FIG. 6. For this purpose, the drain zone 111 is led in sections to the front side V of the semiconductor body HLK. In the case of this embodiment, there follows in the direction of the rear side R a semiconductor zone 123 that is doped complementarily to the drain zone 111 and is connected to reference-ground potential, or the lowest potential occurring in the circuit in which the semiconductor body is connected up, via a terminal electrode 122.

For reasons of clarity, apart from the second semiconductor switch HLS, no further components of the defect identification circuit 110 are illustrated in FIG. 6.

In the case of the exemplary embodiments in accordance with FIGS. 5 and 6, the second semiconductor switch HLS is in each case designed as a vertical transistor whose load path runs perpendicular to the front side V and the rear side R of the semiconductor body HLK.

Figure 12:
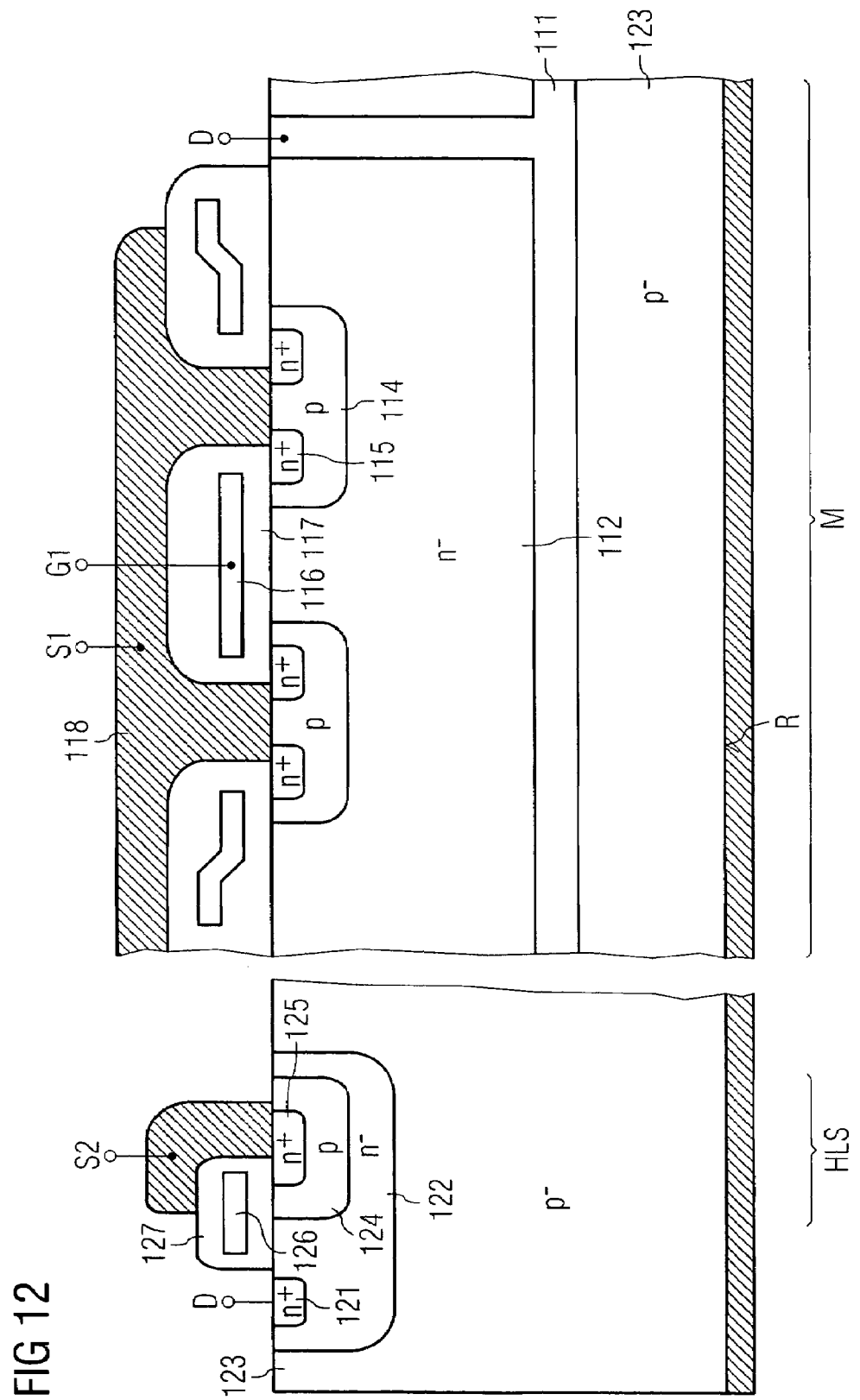
FIG. 12 shows a cross section through the semiconductor body of the semiconductor component arrangement in a further exemplary realization with a second semiconductor switch designed as a lateral transistor.

FIG. 12 shows a modification of the component arrangement illustrated in FIG. 6, in which the second semiconductor switch is designed as a lateral transistor whose load path runs parallel to the front side V of the semiconductor body HLK. Besides the body zone 124 and the source zone 125, in order to form the second semiconductor switch HLS, in the case of this exemplary embodiment a weakly n-doped semiconductor zone 122 is introduced into the p-doped semiconductor substrate 123, which surrounds the body zone 125 and which forms the drift zone of the transistor. At a distance from the source zone 125 and the body zone 124 in the lateral direction, a heavily n-doped drain zone 121 is introduced into the drift zone 122, which is contact-connected via a drain terminal D2. Said drain terminal D2 of the second semiconductor switch and the drain terminal D of the first semiconductor switch may be connected to a common potential during operation of the semiconductor component arrangement, but may also be at different potentials.

Figure 7:
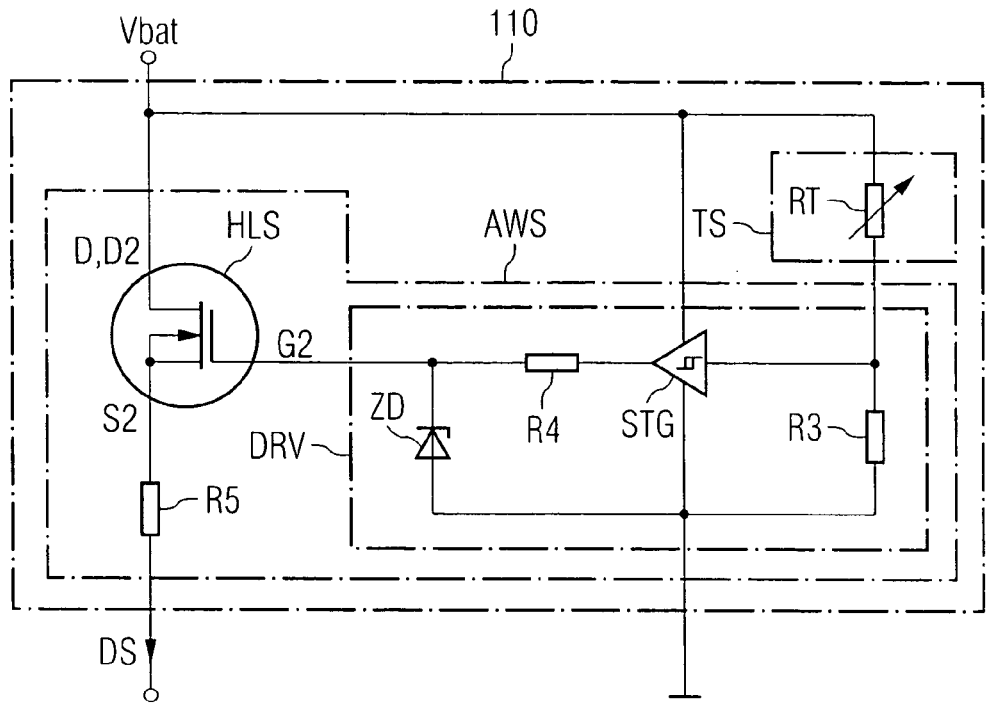
FIG. 7 shows a first exemplary realization in terms of circuitry of the defect identification circuit.

FIG. 7 shows a first exemplary realization in terms of circuitry for the defect identification circuit 110 comprising a temperature sensor TS and an evaluation circuit AWS. The evaluation circuit AWS comprises a drive circuit DRV and a second semiconductor switching element HLS and outputs the defect signal DS if the temperature sensor TS detects a temperature indicating the defect in the first semiconductor switching element M (not illustrated in FIG. 7).

The load path or drain-source path of the second semiconductor switching element HLS is connected between the supply potential Vbat and the defect signal output, at which the defect signal DS is made available. A resistor R5 connected in series with the load path limits the current flow in the event of the second semiconductor switch HLS being in the on state, in order to protect a circuit that evaluates the defect signal DS, by way of example, a microcontroller μC in accordance with FIGS. 3 and 4.

For driving the second semiconductor switch HLS, the evaluation circuit contains a driver circuit DRV that drives the semiconductor switch HLS into the on state or into the off state depending on a temperature signal supplied by the temperature sensor TS. In the example, the temperature sensor TS is designed as a temperature-dependent resistor RT connected in series with a further resistor R3 between supply potential Vbat and reference-ground potential GND. The further resistor R3 is either not temperature-dependent or has a lower temperature dependence than the temperature sensor resistor RT.

A node common to the temperature sensor resistor RT and the further resistor R3 is connected to the input of a Schmitt trigger STG, the output of which is connected to the gate terminal G of the second semiconductor switch HLS via a gate series resistor R4.

The temperature sensor resistor RT has a negative temperature coefficient, by way of example, so that its resistance decreases as the temperature increases, as a result of which the potential at the output of the voltage divider formed by the resistors RT and R3, and thus at the input of the Schmitt trigger STG, increases as the temperature increases. In this case, if the temperature increases to such an extent that the switch-on threshold of the Schmitt trigger STG is reached, then the second semiconductor switch HLS is driven into the on state. The potential at the defect signal output thereby rises to a value which results from the supply potential Vbat minus the voltage drop and also the threshold voltage at the semiconductor switch HLS and minus the voltage drop at the current limiting resistor R5 and which corresponds to a high potential of the defect signal DS.

A zener diode connected between the gate terminal G of the second semiconductor switch HLS and reference-ground potential GND serves for limiting the drive potential of the semiconductor switch HLS.

The temperature sensing resistor RT, the resistor R5 connected in series therewith and the switch-on threshold of the Schmitt trigger STG are coordinated with one another in such a way that the second semi-conductor switch HLS switches on in order to generate a high level of the defect signal DS only when a temperature indicating a defect is reached. This temperature lies in the region of approximately 300° C., by way of example. The temperature sensing resistor may also have a positive temperature coefficient, in this case it being necessary to design the Schmitt trigger such that it drives the second semiconductor switch into the on state when a predetermined threshold voltage is exceeded.

Figure 8:
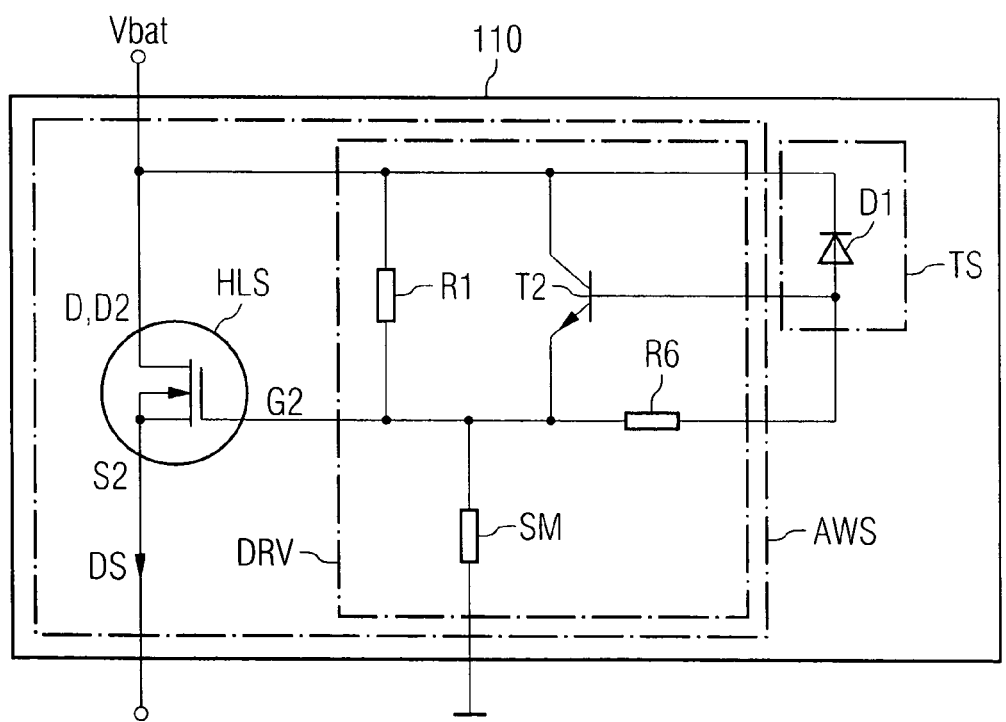
FIG. 8 shows a second exemplary realization in terms of circuitry of the defect identification circuit.

FIG. 8 shows a further exemplary realization in terms of circuitry of the defect identification circuit 110 having a temperature sensor TS and also an evaluation circuit AWS with a drive circuit DRV and a second semiconductor switching element HLS.

In this example, the temperature sensor TS is designed as a diode D1, which is operated in the reverse direction and which carries a specific reverse current at the temperature indicating a defect in the first semiconductor switching element (not illustrated in FIG. 8).

In the example, the driver circuit DRV comprises a series circuit formed by a resistor R1 and a fusible link SM, which is connected between supply potential Vbat and reference-ground potential GND. In this case, the drive terminal of the second semiconductor switching element HLS is connected to a node common to the resistor R1 and the fuse SM. The fuse SM is chosen such that its forward resistance in the intact state is much lower than the resistance of the resistor R1, with the result that the voltage drop across the intact fuse is not sufficient to switch on the second semiconductor switch HLS.

The load path of a transistor T2 is connected in parallel with the resistor R1, said transistor being driven by the temperature sensor designed as a diode D2. With the transistor T2 designed as an npn bipolar transistor, the diode D2 is connected between the collector K thereof and the base B thereof, a drive resistor R6 being connected in series with the diode D2 and between base and emitter of the transistor T2.

If, in the case of this circuit, the temperature-dependent reverse current of the diode D2 reaches such a high value that the voltage drop across the drive resistor R6 suffices to drive the transistor into the on state, then the fuse SM is blown by the load current of the transistor T2 that then flows and the second semiconductor switch is switched on. In this case, the diode D2, the drive resistor R6 and the transistor T2 are coordinated with one another in such a way that the transistor T2 switches on, in order to blow the fuse, only at a temperature indicating a defect, for example a temperature of approximately 300° C.

The resistor R1 in series with the fuse is not necessary for switching on the semiconductor switch HLS in this state since the current supplied by transistor T2 is sufficient for this. However, the resistor R1 ensures that the drive terminal of the second semiconductor switch HLS still remains driven even if the transistor T2 should turn off as the temperature decreases. This ensures that a high level of the defect signal DS is permanently made available even in the event of a given temperature threshold being exceeded a single time.

The fusible link SM serves as a fuse element that can be used to detect that a temperature indicating a defect in the semiconductor switching element M has been reached during operation of the at least one semiconductor switching element M. This information can be read out by subsequently opening the semiconductor body HLK even in the case of failure of the supply voltage.

Figure 9:
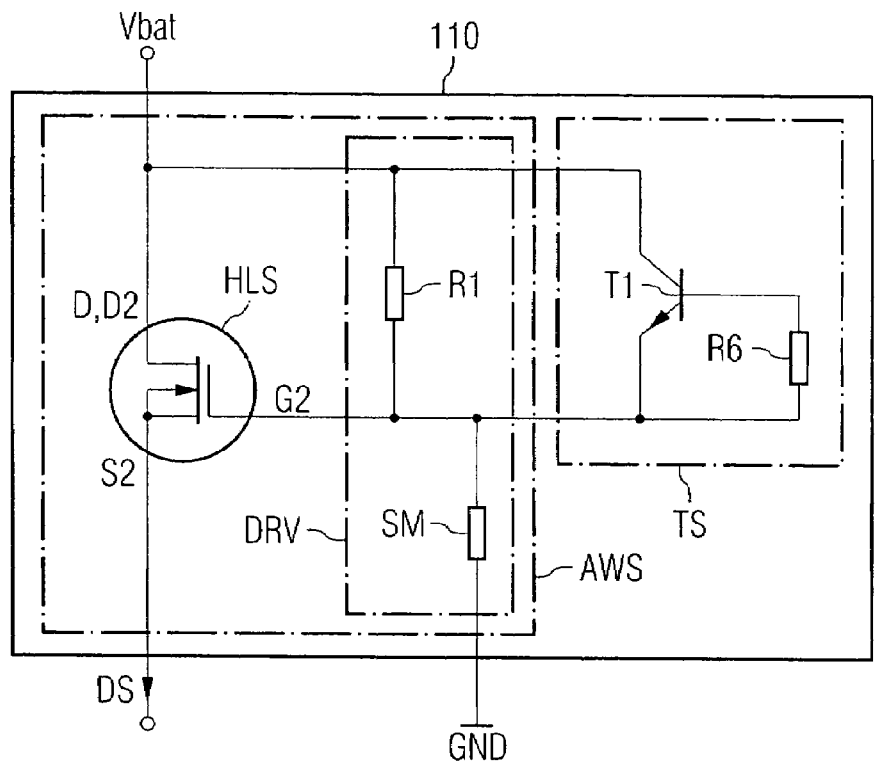
FIG. 9 shows a third exemplary realization in terms of circuitry of the defect identification circuit.
Figure 10:
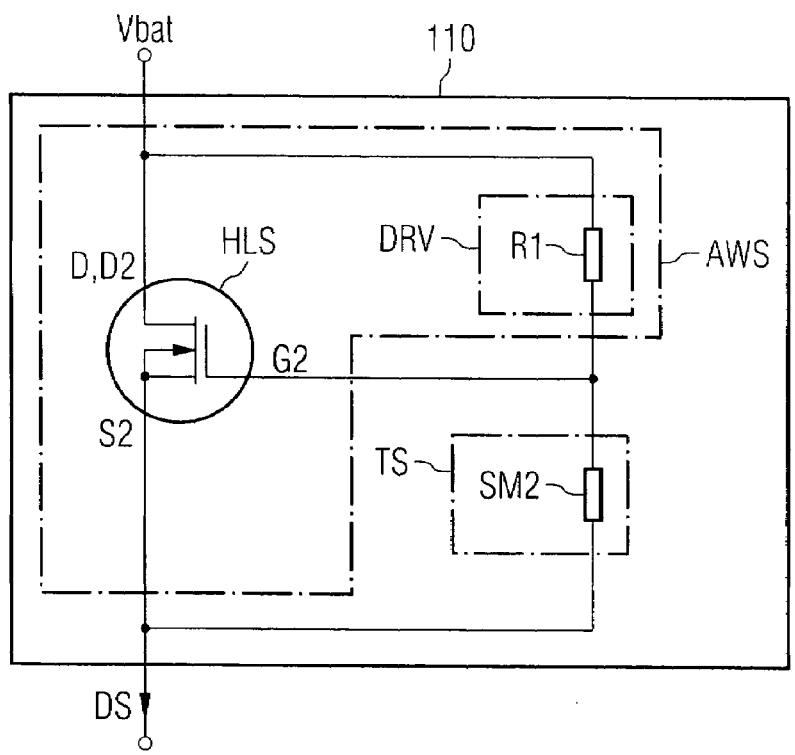
FIG. 10 shows a fourth exemplary realization in terms of circuitry of the defect identification circuit.

FIG. 9 shows a modification of the defect identification circuit illustrated in FIG. 8. This circuit differs from that illustrated in FIG. 8 by virtue of the fact that the diode D1 operated in the reverse direction is dispensed with. In the case of this circuit, the bipolar transistor between whose base and whose emitter the drive resistor R6 is connected serves as temperature sensor TS. In the case of this transistor T2, a temperature-dependent leakage current that increases as the temperature increases flows in the collector-emitter direction. In this case, the fusible link SM and the transistor are coordinated with one another in such a way that when a temperature indicating a defect in the circuit is reached, said leakage current is high enough to blow the fuse SM and to permanently switch on the second semiconductor switch HLS, and thus to put the defect signal DS permanently at a high level.

In the case of this embodiment, too, the fusible link irreversibly stores the information that a temperature indicating a defect has been reached in the circuit.

A further example of a defect identification circuit which permanently outputs a predetermined level, a high level in the present case, of a defect signal DS in the event of a temperature indicating a defect being reached a single time is illustrated in FIG. 9. For driving the second semiconductor switch HLS, this circuit has a series circuit formed by a resistor R1 and a temperature-sensitive fusible link SM2, which are connected in parallel with the load path of the semiconductor switch HLS or between supply potential Vbat and the defect signal output. The drive terminal of the semiconductor switch HLS is connected to a node common to the resistor R1 and the fuse SM2. With an intact fuse SM2 the voltage drop arising across the fuse does not suffice in this case to drive the second semiconductor switch HLS— designed as a MOSFET—into the on state. The resistance R1 is additionally chosen in comparison with the on resistance of the semiconductor switch HLS such that the level of the defect signal DS when semiconductor switch HLS is in the off state differs significantly from the level when semiconductor switch HLS is in the on state.

In the case of this exemplary embodiment, the fusible link SM2 serves as temperature sensor TS, which fusible link, in the event of a temperature indicating a defect being reached, triggers irreversibly and thus opens the connection between gate and source of the second semiconductor switch HLS in order to permanently switch on said semiconductor switch HLS via the resistor R1, and thereby to permanently generate a high level of the defect signal DS.

Figure 11:
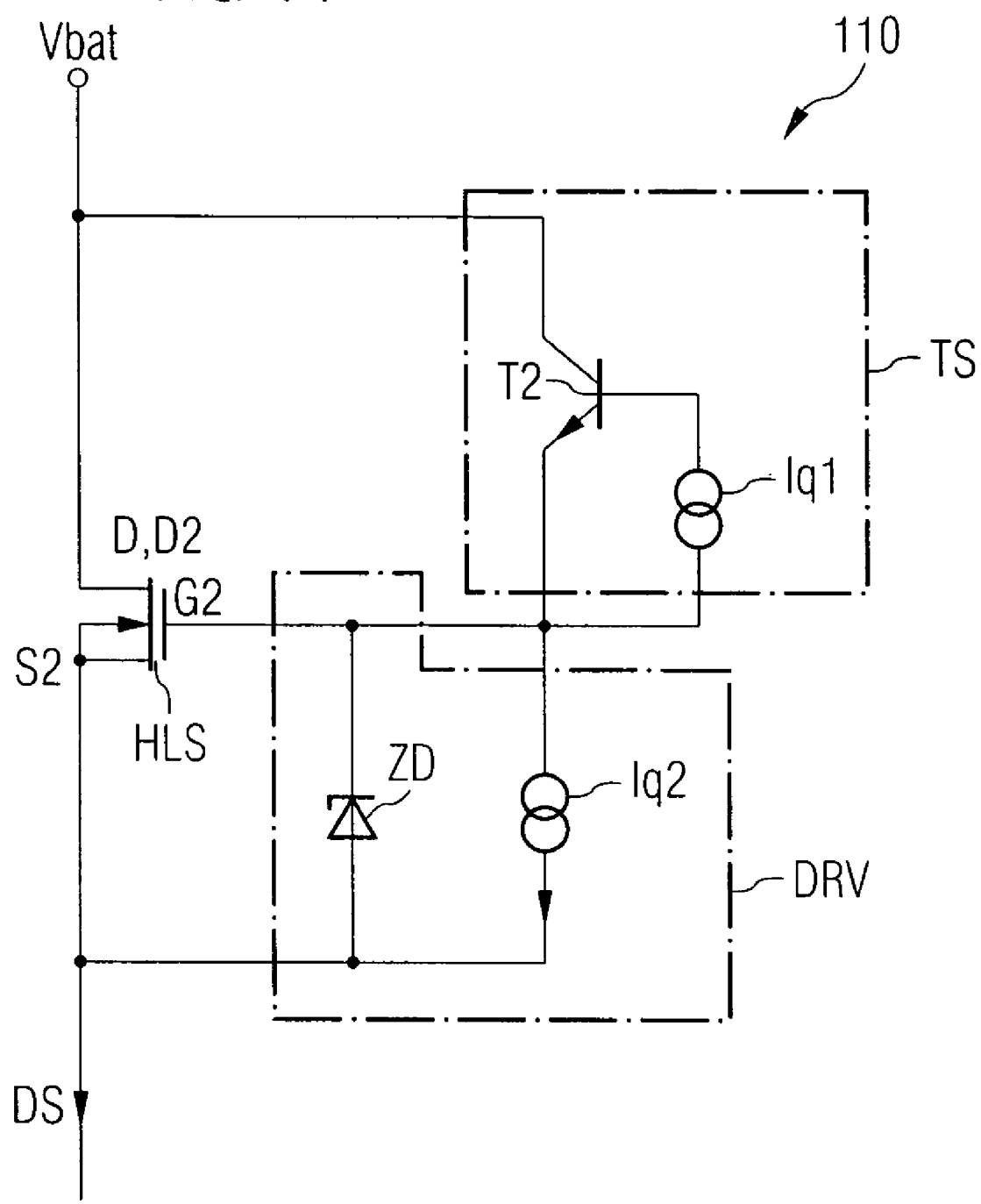
FIG. 11 shows a further exemplary realization in terms of circuitry of the defect identification circuit.

FIG. 11 shows a further exemplary embodiment of the defect identification circuit 110. In the case of this embodiment, the defect signal DS is made available in non-irreversible fashion after detection of a defect. A bipolar transistor T2, the collector-emitter path of which is connected between the supply potential Vbat and the drive terminal of the second semiconductor switch HLS, serves as temperature sensor. A current source Iq1 is connected between base and emitter of said bipolar transistor T2 serving as temperature sensor, which current source, in accordance with the exemplary embodiment in FIG. 9, may also be replaced by a resistor, however.

As load for the temperature sensor TS, a second current course Iq2 is connected between the gate terminal of the second semiconductor switch HLS and the source terminal thereof, or the output of the defect identification circuit 110, which second current source could likewise be replaced by a resistor. For voltage limiting of a drive voltage between gate and source of the second semiconductor switch HLS, there is a zener diode ZD present which is connected in the reverse direction between gate and source.

If, in the case of this embodiment, the temperature rises and the temperature-dependent emitter current supplied by the bipolar transistor T2 thereby rises until it reaches the value of the current supplied by the second current source Iq2, then the voltage across the current source Iq2 rises in order to drive the second semiconductor switch HLS into the on state and thus make available a high level of the defect signal DS.

In the case of this embodiment, the defect signal assumes a low level again in the event of the temperature decreasing. "Storage" of the defect state is not effected in the case of this embodiment.

| List of reference symbols | |
|---|---|
| 110 | Defect identification circuit |
| 111 | Drain zone |
| 112 | Drift zone |
| 113 | Drain electrode |
| 114 | Body zone |
| 115 | Source zone |
| 116 | Gate zone |
| 117 | Gate insulation |
| 118 | Source electrode of M |
| 119 | Source electrode of HLS |
| 120 | Lateral p-channel transistor |
| 121 | Lateral n-channel transistor |
| 122 | Ground terminal |
| 123 | p-doped layer |
| AWS | Evaluation circuit |
| D | Drain zone |
| D1 | Diode |
| DRV | Drive circuit |
| DS | Defect signal |
| G | Gate zone |
| GND | Ground |
| HLK | Semiconductor body |
| HLS | Second semiconductor switching element |
| IN | Drive input |
| LA1 | Supply terminal |
| LA2 | Output terminal |
| LG | Logic unit |
| M | Semiconductor switching element |
| MA | Ground |
| OP | Operational amplifier |
| R | Rear side |
| R1, R2 | Resistor |
| R3 | Resistor |
| R5, R6 | Resistor |
| RT | Temperature-sensitive resistor |
| S | Source zone |
| SA | Control terminal |
| SFD | Signal for defect diagnosis |
| SM | Fusible link |
| SM2 | Fusible link |
| STG | Schmitt trigger |
| T1 | Bipolar transistor |
| T2 | Bipolar transistor |
| TEMPS | Temperature signal |
| TS | Temperature sensor |
| µC | Microcontroller |
| V | Front side |
| Vbat | Supply voltage |
| VIN | Input voltage |
| ZD | Zener diode |

The invention claimed is:

1. A semiconductor component arrangement, comprising:
a semiconductor body having a front side and a rear side;
at least one first semiconductor switching element integrated in the semiconductor body; and
a defect identification circuit integrated in the semiconductor body, the defect identification circuit displaced at a distance from the at least one semiconductor switching element, the defect identification circuit including a temperature sensor and an evaluation circuit, the evaluation circuit coupled to the temperature sensor and configured to generate a defect signal in the event of a sensed temperature indicative of the presence of a defect in the at least one semiconductor switching element, the evaluation circuit having a second semiconductor switching element and a drive circuit therefor.

2. The semiconductor component arrangement as claimed in claim 1, in which the first semiconductor switching element and the second semiconductor switching element have a common load terminal.

3. The semiconductor component arrangement as claimed in claim 2, wherein a load path of the second semiconductor switching element extends between the front side and the rear side of the semiconductor body.

4. The semiconductor component arrangement as claimed in claim 1, wherein the defect identification circuit is arranged in a region of an edge of the semiconductor body.

5. The semiconductor component arrangement as claimed in claim 1, wherein a further circuit arrangement independent of the defect identification circuit is arranged between the defect identification circuit and the first semiconductor switching element.

6. The semiconductor component arrangement as claimed in claim 1, wherein the sensed temperature indicative of the presence of a defect constitutes a temperature that lies between an intrinsic temperature of the semiconductor material used for the semiconductor body and a temperature at which the semiconductor body or connection lines connected to the semiconductor body assume a different state of matter.

7. The semiconductor component arrangement as claimed in claim 1, wherein the drive circuit is configured to obtain a temperature signal from the temperature sensor, and the drive circuit is further configured to drive the second semiconductor switching element in order to generate the defect signal depending on the temperature signal.

8. The semiconductor component arrangement as claimed in claim 1, wherein the defect identification circuit has a separate output for outputting the defect signal.

9. The semiconductor component arrangement as claimed in claim 1, further comprising a drive input for the at least one first semiconductor switching element, and wherein the defect identification signal is further operable to provide the defect signal to said drive input.

10. The semiconductor component arrangement as claimed in claim 1, wherein the defect identification circuit is configured to continuously output the defect signal after the sensed temperature indicating the defect is initially exceeded.

11. The semiconductor component arrangement as claimed in claim 10, wherein which the temperature sensor comprises a fusible link that blows in the event of a predetermined temperature being reached.

12. The semiconductor component arrangement as claimed in claim 1, wherein the temperature sensor comprises a temperature-dependent resistor.

13. The semiconductor component arrangement as claimed in claim 12, wherein the drive circuit comprises a Schmitt trigger configured to be driven in a temperature-dependent manner.

14. The semiconductor component arrangement as claimed in claim 1, wherein the temperature sensor comprises a diode.

15. The semiconductor component arrangement as claimed in claim 14, wherein the drive circuit comprises a bipolar transistor configured to be driven in a temperature-dependent manner.

16. The semiconductor component arrangement as claimed in claim 1, wherein the temperature sensor comprises a bipolar transistor connected between a supply terminal and a control terminal of the second semiconductor switching element.

17. The semiconductor component arrangement as claimed in claim 16, wherein the drive circuit includes a fusible link connected between the control terminal of the second semiconductor switching element and a ground terminal of the defect identification circuit.

18. The semiconductor component arrangement as claimed in claim 1, wherein which the at least one first and the second semiconductor switching elements are designed as vertical transistors.

* * * * *